US011381342B2

(12) United States Patent
Zhu et al.

(10) Patent No.: US 11,381,342 B2
(45) Date of Patent: Jul. 5, 2022

(54) METHOD AND DEVICE FOR INTERLEAVING DATA IN WIRELESS COMMUNICATION SYSTEM

(71) Applicant: Nokia Technologies Oy, Espoo (FI)

(72) Inventors: Kai Zhu, Shanghai (CN); Yu Chen, Shanghai (CN); Liyu Cai, Shanghai (CN)

(73) Assignee: Nokia Technologies OY, Espoo (FI)

(*) Notice: Subject to any disclaimer, the term of this patent is extended or adjusted under 35 U.S.C. 154(b) by 99 days.

(21) Appl. No.: 16/646,230

(22) PCT Filed: Sep. 10, 2018

(86) PCT No.: PCT/CN2018/104812
§ 371 (c)(1),
(2) Date: Mar. 11, 2020

(87) PCT Pub. No.: WO2019/047947
PCT Pub. Date: Mar. 14, 2019

(65) Prior Publication Data
US 2021/0367711 A1    Nov. 25, 2021

(30) Foreign Application Priority Data
Sep. 11, 2017  (CN) .......................... 201710811517.2

(51) Int. Cl.
*G06F 11/10* (2006.01)
*G06F 13/28* (2006.01)
(Continued)

(52) U.S. Cl.
CPC ...... *H04L 1/0071* (2013.01); *H03M 13/2792* (2013.01); *H04W 28/04* (2013.01)

(58) Field of Classification Search
CPC .. H04W 28/04; H03M 13/2792; H04L 1/0071
See application file for complete search history.

(56) References Cited

U.S. PATENT DOCUMENTS 5,056,112 A * 10/1991 Wei ...................... H04L 27/186
                                                                375/280
6,101,465 A * 8/2000 Sazzad .................. H04L 1/0071
                                                                704/200
(Continued)

FOREIGN PATENT DOCUMENTS

CN        1582433 A      2/2005
CN        1685618 A      10/2005
(Continued)

OTHER PUBLICATIONS

International Search Report for PCT/CN2018/104812 dated Nov. 9, 2018.
(Continued)

*Primary Examiner* — Guy J Lamarre
(74) *Attorney, Agent, or Firm* — Fay Sharpe, LLP

(57) ABSTRACT

Embodiments of the present disclosure relate to a method and device for interleaving data in a wireless communication system. For example, a method of interleaving data in a wireless communication system comprises: determining, based on the number of a plurality of bits to be interleaved, a size of an interleaving array for interleaving the plurality of bits, wherein the number of rows is H and the number of columns is 2H-1 in the interleaving array; dividing the plurality of bits into a plurality of subsets based on the size of the interleaving array, such that an i-th subset of the plurality of subsets at most comprises 2(H-1-i)+1 consecutive bits, wherein i is a nonnegative integer smaller than H; writing the plurality of subsets respectively into the interleaving array, comprising for the i-th subset: writing an initial bit in the i-th subset into a position y(i, H-1) in an i-th row and an (H-1)-th column of the interleaving array; and writing subsequent bits of the initial bit respectively into subsequent rows of the i-th row, wherein at least two positions for writing the subsequent bits in an r-th row
(Continued)

comprise y(r, H-1−(r-i)) and y(r, H-1+(r-i)); and reading the written plurality of bits successively column by column from the interleaving array.

17 Claims, 10 Drawing Sheets

(51) Int. Cl.
*G06F 11/30* (2006.01)
*G06F 11/16* (2006.01)
*H04L 1/00* (2006.01)
*H03M 13/27* (2006.01)
*H04W 28/04* (2009.01)

(56) References Cited

U.S. PATENT DOCUMENTS

| | | | | |
|---|---|---|---|---|
| 6,392,572 B1* | 5/2002 | Shiu | H03M 13/2957 | 341/81 |
| 6,466,564 B1* | 10/2002 | Rakib | H03M 13/275 | 370/335 |
| 6,868,519 B2* | 3/2005 | Beacken | H03M 13/15 | 714/701 |
| 7,000,173 B2* | 2/2006 | Buckley | H04L 1/1816 | 714/790 |
| 7,170,849 B1* | 1/2007 | Arivoli | H03M 13/2707 | 370/208 |
| 7,376,203 B2* | 5/2008 | Brunel | H04L 1/0071 | 375/299 |
| 7,392,464 B1* | 6/2008 | Feng | H03M 5/145 | 714/701 |
| 7,743,313 B2* | 6/2010 | Jain | H03M 13/2732 | 714/795 |
| 7,830,957 B2* | 11/2010 | Bai | H04L 1/0071 | 375/240 |
| 7,945,746 B2* | 5/2011 | Treigherman | H04L 1/0071 | 711/157 |
| 2003/0091098 A1 | 5/2003 | Manninen et al. | | |
| 2004/0063399 A1 | 4/2004 | Milbar | | |
| 2006/0188036 A1* | 8/2006 | Brunel | H04L 47/10 | 375/267 |
| 2010/0002792 A1 | 1/2010 | Seyedi-Esfahani | | |
| 2011/0222609 A1* | 9/2011 | Limberg | H04L 1/0065 | 375/240.25 |
| 2012/0127372 A1* | 5/2012 | Taylor | H04L 27/2608 | 348/720 |
| 2020/0304151 A1* | 9/2020 | Hui | H03M 13/2792 | |

FOREIGN PATENT DOCUMENTS

| | | |
|---|---|---|
| CN | 101488763 A | 7/2009 |
| CN | 104579503 A | 4/2015 |
| CN | 205566301 U | 9/2016 |
| CN | 107046451 A | 8/2017 |
| WO | WO 2006/136883 A1 | 12/2006 |
| WO | WO 2015/126096 A1 | 8/2015 |

OTHER PUBLICATIONS

Nokia et al: "Bit-interleaving for polar Codes"; R1-1716786 3$^{rd}$ Generation Partnership Project (3GPP), 3GPP RAN WG1, Meeting NR #3. Nagoya, Japan; Sep. 18-21, 2017 (Sep. 19, 2017), XP051353852, URL:http://www.3gpp.org/ftp/tsg_ran/WGI_RL1/TSGR1_AH/NR_AH_1709/Docs/ [retrieved on Sep. 19, 2017] * figures 3-6 on pp. 3/17-5/17.

Qualcomm Incorporated: "Design and evaluation of Interleaver for Polar cod6s"; R1-1711222 3$^{rd}$ Generation Partnership Project (3GPP), 3GPP RAN WG1, NR Ad-Hoc#2, Qingdao; P.R. China; Jun. 27-30, 2017 (Jun. 26, 2017), XP051300421, URL:http://www.3gpp.org/ftp/Meetings_3GPPSYNC/RANI/Docs/ [retrieved on Jun. 26, 2017] * section 2. *

ZTE: "Consideration on high order modulation and interleaver for Polar Codes"; R1-1713236 3$^{rd}$ Generation Partnership Project (3GPP), 3GPP TSG RAN WG1, Meeting #90, Prague, Czechia; Aug. 21-25, 2017, (Aug. 17, 2017), XP051328049, URL:http://www.3gpp.org/ft/tsg_ran/WGI_RL1/TSGR1_90/Docs/ [retrieved on Aug. 17, 2017]* section 2. *

Ericsson: "Channel Interleaver for Polar Cod6S"; R1-1714691 3$^{rd}$ Generation Partnership Project (3GPP), 3GPP TSG RAN WG1, Meeting #90, Prague, Czechia; Aug. 21-25, 2017, (Aug. 26, 2017). XP051327242, URL:http://www.3gpp.org/ftp/tsg_ran/WGI_RL1/TSGR1_90/Docs/ [retrieved on Aug. 26, 2017]* section 2. *

* cited by examiner

FIG. 2

$$\begin{bmatrix} & & & 0 & & & & \\ & & 1 & 9 & 2 & & & \\ & 3 & 10 & 16 & 11 & 4 & & \\ & 5 & 12 & 17 & 21 & 18 & 13 & 6 & \\ 7 & 14 & 19 & 22 & 24 & 23 & 20 & 15 & 8 \end{bmatrix}$$

METHOD AND DEVICE FOR INTERLEAVING DATA IN WIRELESS COMMUNICATION SYSTEM

FIELD

Embodiments of the present disclosure generally relate to wireless communication technology, and more specifically, to a method, a device and a computer program product for interleaving data in a wireless communication system.

BACKGROUND

Bit errors usually occur in strings on wireless communication channels whereas existing error-correcting techniques can only detect and correct short error strings. To solve the bit error in a string, interleaving technology is usually employed. The interleaving technology can rearrange encoding bits prior to transmission such that consecutive bits in data are transmitted in a non-consecutive way. Accordingly, a long error string may be re-distributed into a plurality of short error strings through a de-interleaving operation at a receiving device so that the error-correcting technology can individually correct the errors.

In the latest 5G communication standard, it is proposed that a data interleaving operation for the uplink control channel is performed using a triangular interleaver. For example, encoding bits at a rate-matching output are successively written row by row into a triangular buffer. Once the triangular buffer is full, the written encoding bits may be read column by column from the triangular buffer. However, the triangular interleaver usually has a constant minimum spread distance, which is defined by the minimum interval of any two symbols at the output of the interleaver, where the any two symbols are adjacent to each other at the input of the interleaver. As a pair of channel interleaver and de-interleaver usually intends to spread or disperse burst errors to enable the error-correcting technique to correct the errors as much as possible, it is apparent that the triangular interleaver with the constant minimum spread distance restricts the decoding performance. Moreover, when a high-order modulation is applied, a plurality of consecutive encoding bits is used for building a single symbol. Therefore, the triangular interleaver with the constant minimum spread distance may fail to evenly disperse error bits in a symbol period, which results into degradation of the decoding performance.

SUMMARY

Simple summary is provided below for each embodiment to facilitate basic understanding of certain aspects of the embodiment. It is noted that the Summary is not intended for identifying key points or describing scopes of the respective embodiments. Instead, the sole purpose here is to present some concepts in a simplified manner as an introduction of the following detailed description.

In a first aspect of the present disclosure, there is provided a method of interleaving data in a wireless communication system. The method comprises: determining, based on the number of a plurality of bits to be interleaved, a size of an interleaving array for interleaving the plurality of bits, wherein the number of rows is H and the number of columns is 2H-1 in the interleaving array; dividing the plurality of bits into a plurality of subsets based on the size of the interleaving array, such that an i-th subset of the plurality of subsets at most comprises 2(H-1-i)+1 consecutive bits, wherein i is a nonnegative integer smaller than H; writing the plurality of subsets respectively into the interleaving array, comprising for the i-th subset: writing an initial bit in the i-th subset into a position y(i, H-1) in an i-th row and an (H-1)-th column of the interleaving array; and writing subsequent bits of the initial bit respectively into subsequent rows of the i-th row, wherein at least two positions for writing the subsequent bits in an r-th row comprise y(r, H-1-(r-i)) and y(r, H-1+(r-i)); and reading the written plurality of bits successively column by column from the interleaving array.

In a second aspect of the present disclosure, there is provided a method of interleaving data in a wireless communication system. The method comprises: determining, based on the number of a plurality of bits to be interleaved, a size of an interleaving array for interleaving the plurality of bits, wherein both the number of rows and the number of columns are H in the interleaving array; dividing the plurality of bits into a plurality of subsets based on the size of the interleaving array, such that an i-th subset of the plurality of subsets at most comprises 2(H-2i)-1 consecutive bits, wherein i is a nonnegative integer smaller than H/2; writing the plurality of subsets respectively into the interleaving array, comprising for the i-th subset: writing an initial bit in the i-th subset into a position in the interleaving array where both a row index and a column index are i; determining at least one position for writing subsequent bits of the initial bit by alternately increasing a row index and a column index with respect to the position; and writing the subsequent bits successively into the determined at least one position; and reading, by starting from a predetermined position of the interleaving array and alternately decreasing a row index and increasing a column index with respect to the predetermined position, the written plurality of bits from the interleaving array.

In a third aspect of the present disclosure, there is provided a device for interleaving data in a wireless communication system. The device comprises: a processor; and a memory storing instructions which, when executed by the processor, cause the device to perform the method according to the first aspect.

In a fourth aspect of the present disclosure, there is provided a device for interleaving data in a wireless communication system. The device comprises: a processor; and a memory storing instructions which, when executed by the processor, cause the device to perform the method according to the second aspect.

In a fifth aspect of the present disclosure, there is provided a computer-readable storage medium comprising machine-executable instructions which, when executed by a device, cause the device to perform the method according to the first aspect.

In a sixth aspect of the present disclosure, there is provided a computer-readable storage medium comprising machine-executable instructions which, when executed by a device, cause the device to perform the method according to the second aspect.

According to the following description, the solution for interleaving data according to embodiments of the present disclosure can remove the restriction brought by the constant minimum spread distance of the triangular interleaver, thereby greatly lowering Block Error Ratio (BLER) of a system. Besides, this solution supports efficient parallel write/read operations for an interleaving memory, which can greatly boost the system efficiency and reduce the system delay while lowering consumption of the system memory.

It should be appreciated that the contents described in this Summary are not intended to identify key or essential features of the embodiments of the present disclosure, or limit the scope of the present disclosure. Other features of the present disclosure will be understood more easily through the following description.

BRIEF DESCRIPTION OF THE DRAWINGS

Through the following contents and claims, the objectives, advantages and other features of the present invention will become more apparent. Here, for the purpose of example, preferred embodiments are described in a non-restrictive way with reference to the drawings, in which:

FIG. 2 illustrates a schematic diagram of a conventional triangular interleaver;

Throughout the drawings, same or corresponding signs indicate same or corresponding parts.

DETAILED DESCRIPTION OF EMBODIMENTS

In the following description, many details are elaborated for the purpose of explanation. However, those ordinary skilled in the art will realize that the present invention may be implemented without using the details. Therefore, the present invention is not limited by the illustrated embodiments and instead should be entitled to the broadest scope consistent with the principles and features described herein.

It should be understood that the term "first" and "second" are used only to discriminate one element from another while the first element in fact may also be known as second element and vice versa. Besides, it also should be appreciated that "comprise" and "include" are provided only for explaining existence of the stated features, elements, functions or components without excluding one or more other features, elements, functions or components.

To facilitate description, some embodiments of the present invention are introduced herein in the setting of wireless communications, such as cellular communications, and terms in Long Term Evolution/Long Term Evolution-Advanced (LTE/LTE-A) formulated by 3GPP or 5G are adopted. However, as understood by those skilled in the art, embodiments of the present disclosure certainly are not limited to a wireless communication system under wireless communication protocols formulated by 3GPP and instead may also be applied into communication systems having similar problems, for example, a WLAN, wired communication systems or other communication systems to be developed in the future etc.

Similarly, a terminal device in the present disclosure may be a User Equipment (UE) and may also be any terminals with wired or wireless communication features, including but is not limited to, a cellphone, a computer, a personal digital an assistant, a game console, a wearable device, an on-board communication device, a Machine-Type Communication (MTC) device, a Device-to-Device (D2D) communication device and a sensor etc. The term "terminal device" can be used interchangeably with UE, mobile station, subscriber station, mobile terminal, user terminal or wireless device. Besides, the network device may be a network node, such as a Node B (or NB), a Base Transceiver Station (BTS), Base Station (BS), or a Base Station Subsystem (BSS), a relay, a Remote Radio Head (RRH), an Access Node (AN) and an Access Point (AP) etc.

Figure 1A:
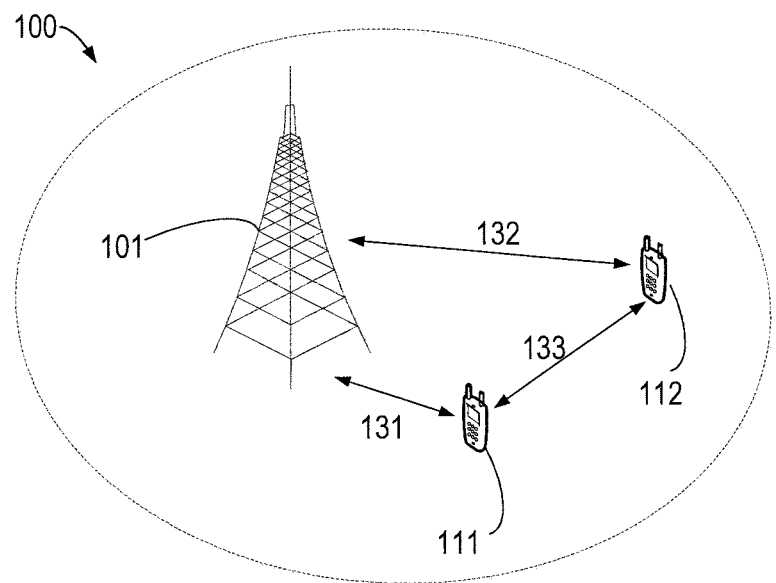
FIG. 1A illustrates a schematic diagram of an example wireless communication system 100 in which a method according to embodiments of the present disclosure can be implemented.

FIG. 1A illustrates a schematic diagram of an example wireless communication system 100 in which a method according to embodiments of the present disclosure can be implemented. The wireless communication system 100 may include one or more network devices 101. For example, in the wireless communication system 100, the network device 101 may be embodied as a base station, for example, an evolved Node B (eNodeB or eNB). It should be appreciated that the network device 101 may also be embodied in other forms, such as a node B, a Base Transceiver Station (BTS), a Base Station (BS), or a Base Station Subsystem (BSS) and a relay etc. The network device 101 provides wireless connections to a plurality of terminal devices 111-112 within its coverage. The terminal devices 111 and 112 may communicate with the network device via a wireless transmission channel 131 or 132 and/or communicate with each other via a transmission channel 133.

Figure 1B:
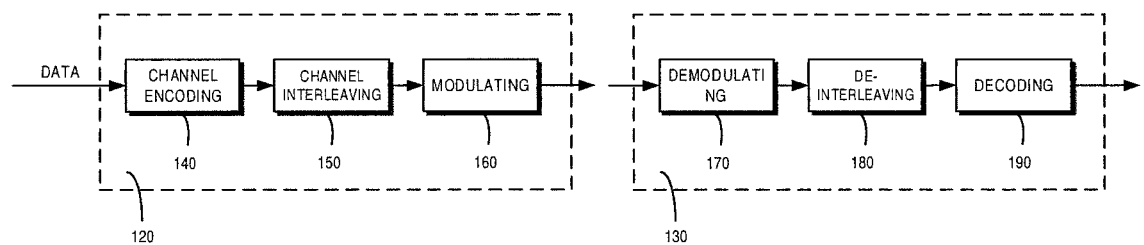
FIG. 1B illustrates a simplified schematic diagram of processing performed at a transmitting device 120 and a receiving device 130 of the wireless communication system 100.

FIG. 1B illustrates a simplified schematic diagram of processing performed at a transmitting device 120 and a receiving device 130 of the wireless communication system 100. Both the network device 101 and the terminal devices 111 and 112 in FIG. 1A can act as the transmitting device 120 and/or the receiving device 130.

As shown in FIG. 1B, to ensure a reliable transmission of data (including control signaling), the transmitting device performs channel encoding (140) on the data to be transmitted to introduce redundancy against possible distortions in the transmission channel (e.g., 131, 132, and 133 in FIG. 1A). Besides, channel interleaving (150) may be further performed on the channel-encoded data prior to its transmission to rearrange encoding bits, such that consecutive bits in the data are dispersed. Afterwards, the interleaved data may be modulated (160). A process that is the reverse of the process at the transmitting device is performed at the receiving device, i.e., the received signal is demodulated (170), de-interleaved (180) and decoded (190) to restore the transmitted data.

Figure 2:
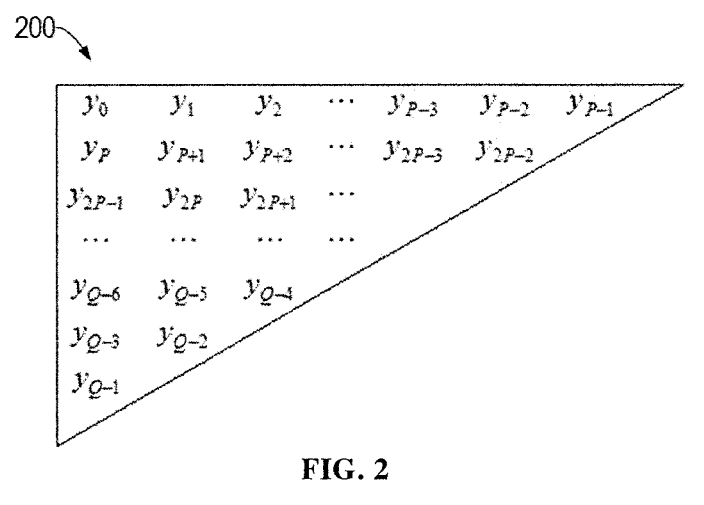

As described above, a triangular interleaver is proposed in the latest 5G communication standard to implement channel interleaving for uplink control channels. FIG. 2 illustrates a schematic diagram of a conventional triangular interleaver.

For example, N encoding bits output at 140 in FIG. 1 may be written row by row into a triangular buffer 200 from top to bottom as shown in FIG. 2. The triangular buffer 200 has a structure of an isosceles right triangle with a side length P, where P is the minimum integer satisfying $P(P+1)/2 \geq N$. As shown in FIG. 2, the triangular buffer 200 can save Q bits at most. When Q>N, (Q−N) invalid bits may be filled after the N encoding bits. That is, a total of Q bits may be written row by row into positions $y_0, y_1 \ldots y_{Q-1}$ of the triangular buffer 200 from top to bottom. Once the triangular buffer 200 is full, the written encoding bits for example may be read from the triangular buffer 200 column by column from left to right and from top to bottom, to obtain interleaved encoding bits.

However, the triangular interleaver 200 has a constant minimum spread distance, which is defined by the minimum interval of any two bits at the output of the interleaver, where the any two bits are adjacent to each other at the input of the interleaver. For example, as shown in FIG. 2, regardless of the number of the input encoding bits N and the side length of the isosceles right triangle P, the bit at the position $y_{P-2}$ in the triangular buffer 200 is only one bit apart from the bit at the closest adjacent position $y_{P-1}$ after interleaving, i.e., the bit at the position $y_{2P-2}$. In other words, the minimum spread distance of the triangular buffer 200 is $d_{min}=2$.

As a pair of channel interleaver and de-interleaver usually intend to spread or disperse burst errors to allow the error-correcting technique to correct the errors as much as possible, it is apparent that the triangular interleaver 200 with the minimum spread distance of $d_{min}=2$ restricts the decoding performance. Moreover, when a high-order modulation is applied, a plurality of consecutive encoding bits is used for building a single symbol. Therefore, the triangular interleaver 200 with the minimum spread distance of $d_{min}=2$ may fail to evenly disperse the error bits in a symbol period, which results in degradation of the decoding performance.

To solve the above problems and one or more of other potential problems, example embodiments of the present disclosure provide a solution for interleaving data in a wireless communication system. This solution continues to employ the triangular interleaving buffer in the conventional solution, but improves the way of writing/reading data into/from the triangular interleaving buffer. This solution can remove the restriction brought by the constant minimum spread distance of the triangular interleaver and significantly lower BLER of the system. In addition, the solution supports efficient parallel write/read operations for an interleaving memory, thereby greatly reducing system delays.

The channel interleaving solution according to embodiments of the present disclosure is now described with reference to the following drawings. For the sake of discussion, the following drawings are described with reference to the environment shown in FIG. 1.

Figure 3:
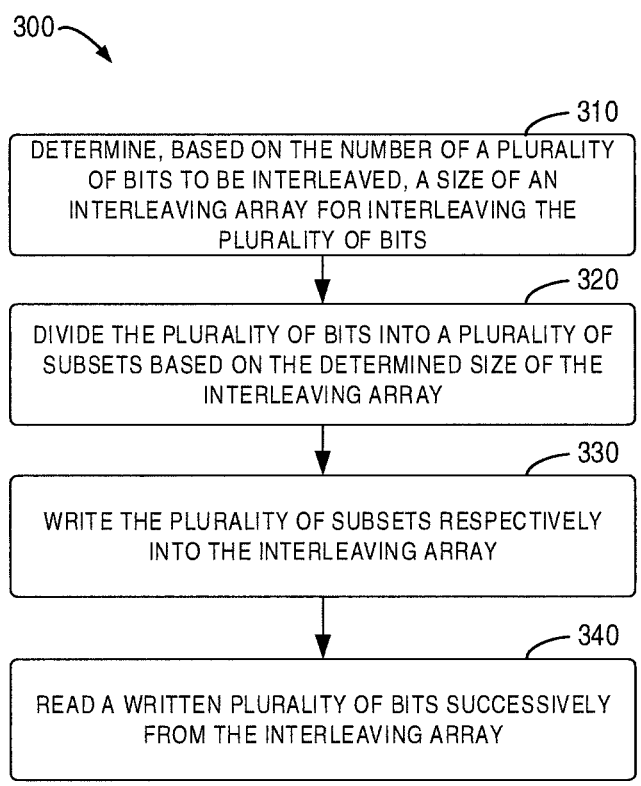
FIG. 3 illustrates a flowchart of a method 300 for interleaving data according to embodiments of the present disclosure.

FIG. 3 illustrates a flowchart of a method 300 for interleaving data according to embodiments of the present disclosure. The method 300 is implemented at a communication device which acts as the transmitting device in the communication network 100. For example, the communication device may be the terminal device 111, 112 or the network device 101 in FIG. 1. It should be understood that the method 300 also may include additional steps not shown and/or omit the already shown steps and the scope of the present disclosure is not limited in this regard.

As shown in FIG. 3, the size of an interleaving array for interleaving a plurality of bits is determined based on the number of the plurality of bits to be interleaved at block 310.

In some embodiments, the plurality of bits to be interleaved may be N encoding bits output at 140 in FIG. 1. Particularly, the plurality of bits to be interleaved may also be rate-matching output bits. For example, a sequence of N bits to be interleaved may be represented as $\pi = \{b_0, b_1, b_2, \ldots b_{N-1}\}$ and N>1.

In some embodiments, the number of rows and the number of columns in the interleaving array may be determined based on the number of the plurality of bits to be interleaved N. The number of rows H in the interleaving array may be the minimum integer satisfying $H^2 \geq N$ and the number of columns is 2H-1. For example, when N=25, the number of rows H may be determined as 5 and the number of columns is 9 for the interleaving array.

In some embodiments, a region for writing a plurality of bits in the interleaving array forms an isosceles triangle, where the height of the isosceles triangle is H (row) and the length of the base of the isosceles triangle is 2H-1 (column). Accordingly, a total of $Q=H^2$ bits may be accommodated in the interleaving array. Throughout the description, "interleaving array" may be used interchangeably with "interleaving buffer," "triangular interleaving buffer" and "triangular interleaver."

At block 320, the plurality of bits is divided into a plurality of subsets based on the determined size of the interleaving array. In some embodiments, N bits may be divided into a plurality of subsets based on the determined height H of the triangular interleaver, where the i-th subset at most may include 2(H-1-i)+1 consecutive bits and i=0, 1 . . . H-1. For example, when N=25 and H=5, the bit sequence to be interleaved $\pi = \{b_0, b_1, \ldots b_{24}\}$ may be divided into a plurality of subsets, where the zeroth subset is $\{b_0, b_1, \ldots b_8\}$; the first subset is $\{b_9, b_{10}, \ldots b_{15}\}$; the second subset is $\{b_{16}, b_{17}, \ldots b_{20}\}$; the third subset is $\{b_{21}, b_{22}, b_{23}\}$ and the fourth subset is $\{b_{24}\}$.

Figure 4:
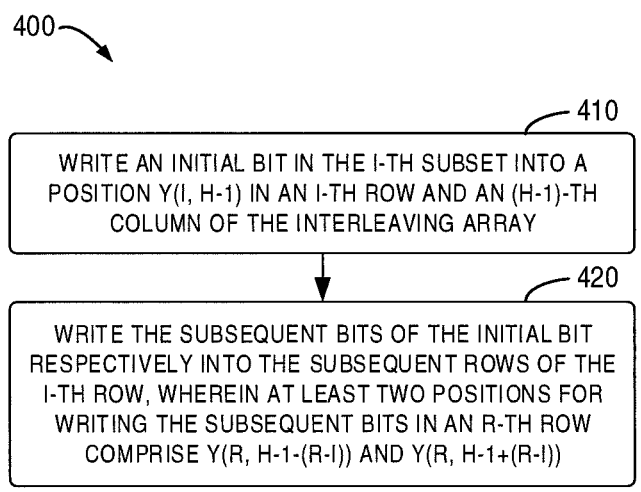
FIG. 4 illustrates a flowchart of a method of writing one of the plurality of subsets into an interleaving array according to embodiments of the present disclosure.

At block 330, the plurality of subsets is respectively written into the interleaving array. For example, FIG. 4 illustrates a flowchart of a method 400 for writing the i-th subset in the plurality of subsets into the interleaving array according to embodiments of the present disclosure. The method 400 is implemented at the communication device, which acts as the transmitting device in the communication network 100. For example, the communication device may be the terminal device 111, 112 or the network device 101 in FIG. 1. It should be understood that the method 400 is an example implementation of the block 330 shown in FIG. 3.

As shown in FIG. 4, at block 410, the initial bit in the i-th subset is written into a middle position y(i, c) of the i-th row in the interleaving array, where c=H-1. In the description, "y(a, b)" is used for describing a position in the interleaving array, where a represents a row index and b indicates a column index, both the row index and the column index being numbered from zero in the text. Next, the bits subsequent to the initial bit are successively written into the rows after the i-th row at block 420, where at least two positions in the r-th row for writing the subsequent bits include y(r, c−(r-i)) and y(r, c+(r-i)).

In this way, the i-th subset may be written into the interleaving array. The bit sequence to be interleaved π may be written into the interleaving array by applying the method 400 to each of the plurality of subsets.

Figure 5:
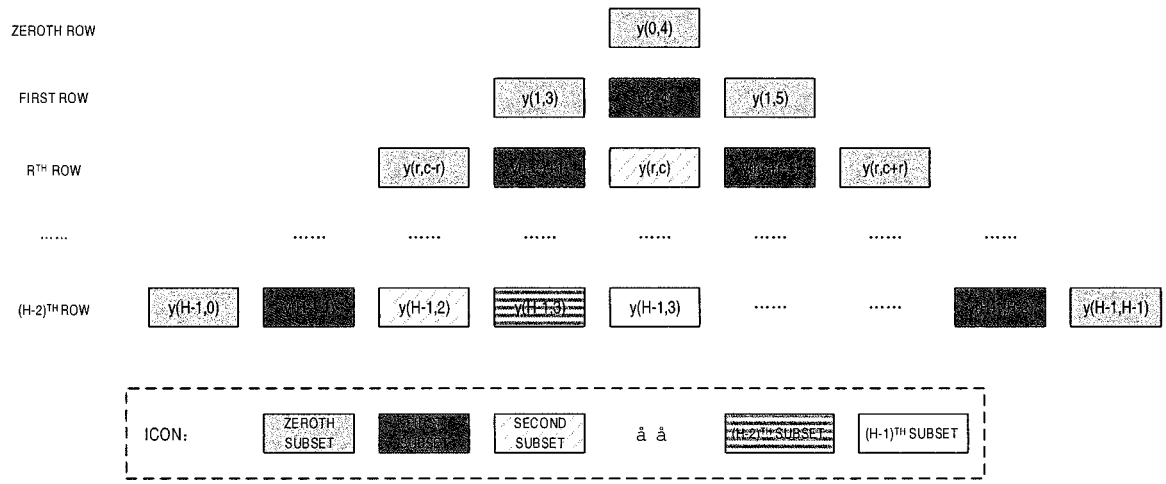
FIG. 5 illustrates a flowchart of a method of writing a plurality of subsets into an interleaving array according to embodiments of the present disclosure.

FIG. 5 illustrates a schematic diagram of writing a plurality of subsets into the interleaving array according to embodiments of the present disclosure. Writing positions of different subsets are respectively represented using various icons in FIG. 5. As shown, the bits in the zeroth subset may be successively written into positions y(0, 4), y(1, 3), y(1, 5) . . . y(H-1, H-1) in the interleaving array. In other words, the bits in the zeroth subset for example may be alternately written to two sides of the isosceles triangle in a left side-to-right side order. Similarly, the bits in the first subset are successively written into positions y(1, 4), y(r, c−(r-1)), y(r, c+(r-1) y(H-1, H-2) in the interleaving array and so on. Alternatively, in some further embodiments, the write operation may also be performed in a right side-to-left side order. For example, the bits in the zeroth subset may be successively written into positions y(0, 4), y(1, 5), y(1, 3) . . . y(H-1, 0) in the interleaving array and the bits in the first subset are successively written into positions y(1, 4), y(r, c+(r-1)), y(r, c−(r-1)) y(H-1, 1) in the interleaving array and so on. Since the triangular interleaving buffer can accommodate $Q=H^2$ bits in total, (Q-N) invalid bits may be filled after the N encoding bits when Q>N.

Figures 6, 7:
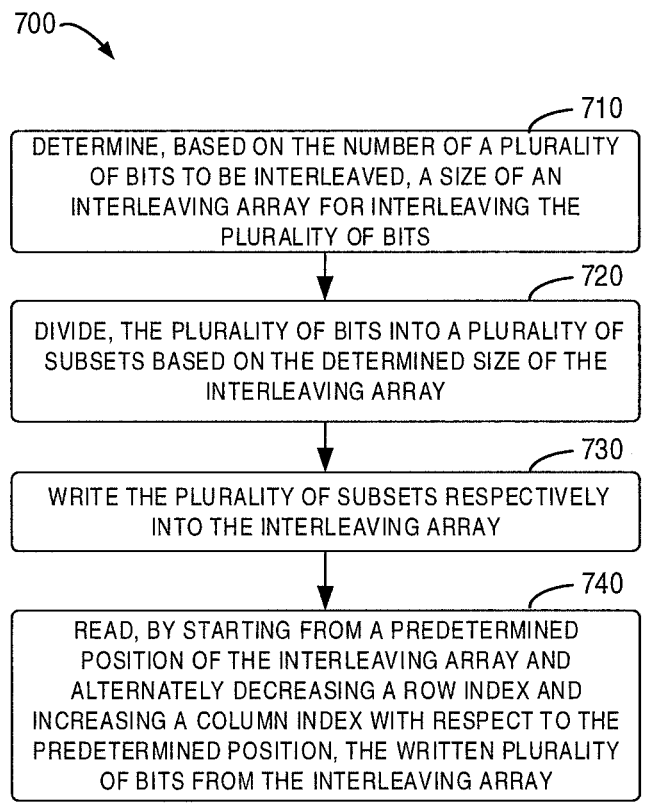
FIG. 6 illustrates a flowchart of a method of writing a plurality of subsets into an interleaving array according to embodiments of the present disclosure.
FIG. 7 illustrates a flowchart of a method 700 of interleaving data according to embodiments of the present disclosure.

FIG. 6 illustrates a schematic diagram of writing a plurality of subsets into the interleaving array when N=25 and H=5. Digits in FIG. 6 represent serial numbers of the bits to be interleaved that are written. As shown in FIG. 6, taking the zeroth subset $\{b_0, b_1, \ldots b_8\}$ for example, the initial bit $b_0$ may be written into the position y(0, 4) in the interleaving array. Bits $b_1$ and $b_2$ subsequent to the initial bit may be respectively written into positions y(1, 3) and y(1, 5) in the interleaving array. Similarly, bits $b_3$ and $b_4$ may be respectively written into positions y(2, 2) and y(2, 6) in the interleaving array; bits $b_5$ and $b_6$ may be respectively written into positions y(3, 1) and y(3, 7) in the interleaving array and bits $b_7$ and $b_8$ may be respectively written into positions y(4, 0) and y(4, 8) in the interleaving array. The writing positions of the first to fourth subsets may be done in the same fashion.

Additionally or alternatively, in some embodiments, a plurality of subsets may be written in parallel into the interleaving array. In the example of FIG. 5, different subsets represented by various icons may be written into the interleaving array in parallel to boost write efficiency and reduce system delay.

Returning to FIG. 3, the method 300 proceeds to block 340, at which a written plurality of bits are successively read from the interleaving array. In some embodiments, the written N bits may be read from the interleaving array by starting from the zeroth column from left to right and in a column by column fashion from top to bottom with the filled invalid bits skipped. In the example shown by FIG. 6, the read bit sequence is: $\{b_7, b_5, b_{14}, b_3, b_{12}, b_{19}, b_1, b_{10}, b_{17}, b_{22}, b_0, b_9, b_{16}, b_{21}, b_{24}, b_2, b_{11}, b_{18}, b_{23}, b_4, b_{13}, b_{20}, b_6, b_{15}, b_8\}$. In some further embodiments, the written N bits may also be read from the interleaving array by starting from the (H-1)-th column from right to left and in a column by column fashion from top to bottom (or from bottom to top) with the filled invalid bits skipped. In some other embodiments, the written N bits may also be read in a sequence different from the above ones.

Additionally or alternatively, in some embodiments, blocks 330 and 340 may at least partially be performed in parallel to further boost efficiency and reduce system delay.

For example, in the conventional solution shown by FIG. 2, the written encoding bits are successively read from the triangular buffer 200 column by column only when the write operation for the position $y_{Q-1}$ in the triangular buffer 200 is completed. Since the position $y_{Q-1}$ corresponds to the last bit in the bit sequence, it means that write and read operations are serially performed in the conventional solution. On the contrary, embodiments of the present disclosure can support at least in part the parallel execution of the write and read operations. In the example of FIG. 5, when the write operation for the position y(H-1, 0) is completed, the read operation may start from the position y(H-1, 0). As y(H-1, 0) belongs to the zeroth subset, it can be written into the interleaving array at an early time. Therefore, embodiments of the present disclosure can support at least in part the parallel execution of the write and read operations to further boost efficiency and reduce system delay. Meanwhile, the parallel execution of write and read operations may bring extra benefits to memory occupation and time consumption. It can be observed that after the memory cells in the interleaving array are read, they can be recycled and reused again for other purposes sooner.

According to the above description, embodiments of the present disclosure can remove the restriction brought by the constant minimum spread distance of the triangular interleaver by improving the way of writing and reading data into and from the triangular interleaving buffer, thereby enhancing the decoding performance of a system. Through parallel execution of the write operation and/or at least partial parallel execution of the write and read operations, embodiments of the present disclosure can greatly boost the system efficiency and reduce the system delay while lowering the consumption of the system memory.

In some embodiments, the solution for interleaving data according to embodiments of the present disclosure may also be applied into the interleaving buffer with an isosceles right triangle structure. Detailed explanations are further provided below with reference to FIGS. 7-10.

FIG. 7 illustrates a flowchart of a method 700 of interleaving data according to embodiments of the present disclosure. The method 700 is implemented at the communication device, which acts as the transmitting device in the communication network 100. For example, the communication device may be the terminal device 111, 112 or the network device 101 in FIG. 1. It should be understood that the method 700 also may include additional steps not shown and/or omit the already shown steps and the scope of the present disclosure is not limited in this regard.

As shown in FIG. 7, the size of the interleaving array for interleaving a plurality of bits is determined based on the number of the plurality of bits to be interleaved at block 710.

In some embodiments, the plurality of bits to be interleaved may be N encoding bits output at 140 in FIG. 1. Particularly, the plurality of bits to be interleaved may also be rate-matching output bits. For example, the sequence of the N bits to be interleaved may be represented as $\lambda = \{b_0, b_1, b_2, \ldots b_{N-1}\}$ and N>1.

In some embodiments, the number of rows and the number of columns in the interleaving array may be determined based on the number of the plurality of bits to be interleaved N. For example, the number of rows H in the interleaving array may be the minimum integer satisfying $$\frac{H(H+1)}{2} \geq N$$

and the number of columns is equal to the number of rows. For example, when N=21, both the number of rows and the number of columns H for the interleaving array are 6. That is, the region for writing the plurality of bits in the interleaving array forms an isosceles right triangle, where the side of the isosceles right triangle is H (row or column). Accordingly, a total of $$Q = \frac{H(H+1)}{2}$$

bits may be accommodated in the interleaving array.

At block 720, the plurality of bits is divided into a plurality of subsets based on the determined size of the interleaving array. In some embodiments, N bits may be divided into the plurality of subsets based on the determined side length H of the triangular interleaver, where the i-th subset at most may include 2(H-2i)-1 consecutive bits and i is a nonnegative integer smaller than H/2. For example, when N=21 and H=6, the bit sequence to be interleaved π={$b_0$, $b_1$, ... $b_{20}$} may be divided into a plurality of subsets, where the zeroth subset is {$b_0$, $b_1$, ... $b_{10}$}; the first subset is {$b_{11}$, $b_{12}$, ... $b_{17}$} and the second subset is {$b_{18}$, $b_{19}$, $b_{20}$}.

Figure 8:
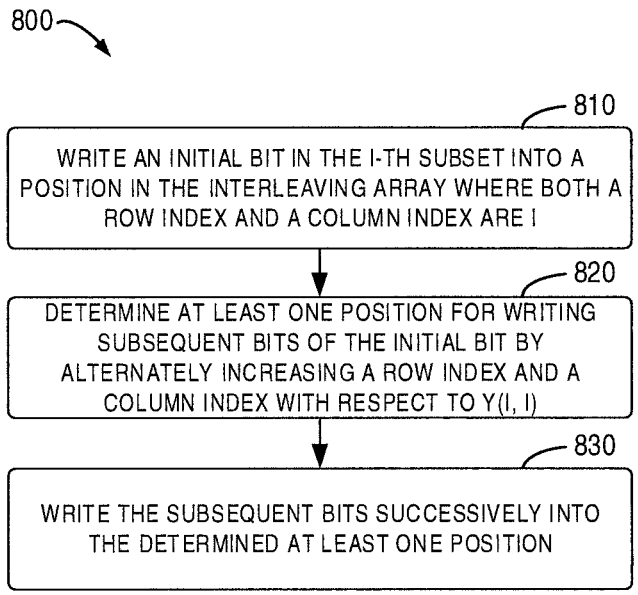
FIG. 8 illustrates a flowchart of a method 800 for writing one of the plurality of subsets into an interleaving array according to embodiments of the present disclosure.

At block 730, a plurality of subsets are respectively written into the interleaving array. For example, FIG. 8 illustrates a flowchart of a method 800 of writing the i-th subset in the plurality of subsets into the interleaving array according to embodiments of the present disclosure. The method 800 is implemented at the communication device, which acts as the transmitting device in the communication network 100. For example, the communication device may be the terminal device 111, 112 or the network device 101 in FIG. 1. It should be understood that the method 800 is an example implementation of the block 730 shown in FIG. 7.

As shown in FIG. 8, at block 810, the initial bit in the i-th subset is written into a position where both the row index and the column index are i in the interleaving array, i.e., y(i, i). Next, at block 820, at least one position for writing subsequent bits of the initial bit is determined by alternately increasing the row index and the column index with respect to y(i, i). For example, the subsequent bits in the i-th subset may include the first bit immediately following the initial bit and the second bit immediately following the first bit, then the positions for writing the first bit and the second bit may be y(i+1, i) and y(i, i+1), respectively. Assuming the subsequent bits in the i-th subset also include the third bit immediately following the second bit and the fourth bit immediately following the third bit, then the positions for writing the third bit and the fourth bit may be y(i+2, i) and y(i, i+2), respectively, and so on. At block 830, the subsequent bits are successively written into the determined at least one position.

In this way, the i-th subset may be written into the interleaving array. The bit sequence to be interleaved π may be written into the interleaving array by applying the method 800 to each of the plurality of subsets. Since the triangular interleaving buffer can accommodate a total of $$Q = \frac{H(H+1)}{2} \text{ bits,}$$

(Q-N) invalid bits may be filled after the N encoding bits when Q>N.

Figure 9:
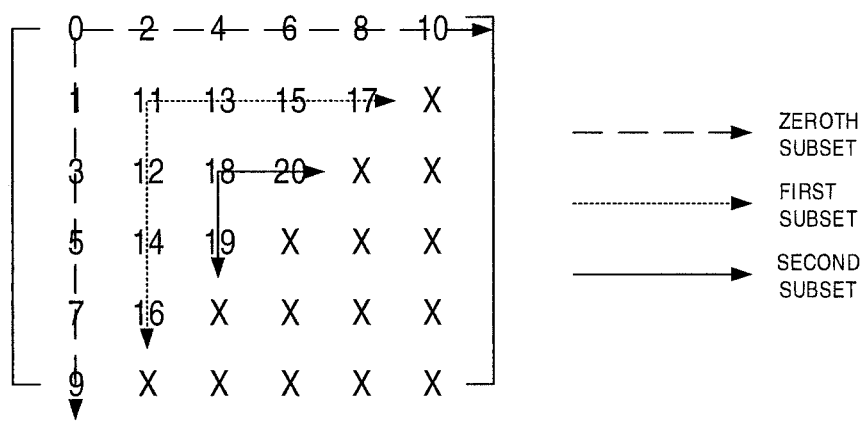
FIG. 9 illustrates a flowchart of a method of writing a plurality of subsets into an interleaving array according to embodiments of the present disclosure.

FIG. 9 illustrates a schematic diagram of writing a plurality of subsets into the interleaving array when N=21 and H=6. Digits in FIG. 9 denote serial numbers of the bits to be interleaved that are written and "X" represents invalid position. As shown in FIG. 9, taking the zeroth subset {$b_0$, $b_1$, ... $b_{10}$} for example, the initial bit $b_0$ may be written into the position y(0, 0) in the interleaving array. Bits $b_1$ and $b_2$ subsequent to the initial bit may be respectively written into positions y(1, 0) and y(0, 1) in the interleaving array. Similarly, bits $b_3$ and $b_4$ may be respectively written into positions y(2, 0) and y(0, 2) in the interleaving array ... bits $b_9$ and $b_{10}$ may be respectively written into positions y(5, 0) and y(0, 5) in the interleaving array. The writing positions of the first and second subsets may be done in the same fashion.

In particular, in some embodiments, a plurality of subsets may be written in parallel into the interleaving array. In the example of FIG. 9, different subsets may be written in parallel into the interleaving array to boost write efficiency and reduce system delay.

Returning to FIG. 7, the method 700 proceeds to block 740. By starting from a predetermined position, a plurality of written bits is read from the interleaving array by alternately decreasing the row index and increasing the column index with respect to the predetermined position.

In some embodiments, the written N bits may be read from the interleaving array by starting from y(H-1, 0) by alternately decreasing the row index and increasing the column index with respect to the position y(H-1, 0) and skipping invalid positions and/or filled invalid bits. For example, the sequence of positions read based on this is: y(H-1, 0); y(H-2, 0), y(H-1, 1); y(H-3, 0), (H-2, 1), y(H-1, 2); ... ; y(0, H-2), y(1, H-1); y(0, H-1). Particularly, invalid positions and/or invalid bits therein are skipped.

Figure 10:
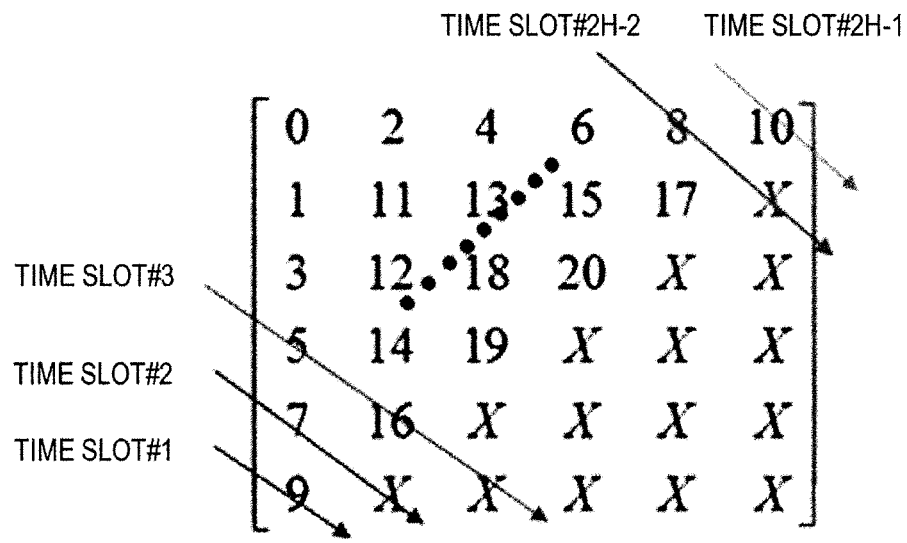
FIG. 10 illustrates a schematic diagram of reading a plurality of written bits from an interleaving array.

In this aspect, FIG. 10 illustrates a schematic diagram of reading 21 written bits from the interleaving array shown in FIG. 9. For example, the sequence of positions read at the time slot #1 is: y(5, 0) and the read bit is $b_9$; the sequence of positions read at the time slot #2 is: y(4, 0), y(5, 1) and the read bit is $b_7$, where the position y(5, 1) is invalid and is therefore skipped. The sequence of positions read at the time slot #3 is: y(3, 0), y(4, 1), y(5, 2); and the read bits are $b_5$ and $b_{16}$, where the position y(5, 2) is invalid and is therefore skipped and so on. Hence, the sequence of read bits is: {$b_9$, $b_7$, $b_5$, $b_{16}$, $b_3$, $b_{14}$, $b_1$, $b_{12}$, $b_{10}$, $b_0$, $b_{11}$, $b_{18}$, $b_2$, $b_{13}$, $b_{20}$, $b_4$, $b_{15}$, $b_6$, $b_{17}$, $b_8$, $b_{10}$}.

In some further embodiments, the written N bits may also be read from the interleaving array by starting from y(0, H-1) by alternately decreasing the column index and increasing the row index with respect to the position y(0, H-1) and skipping invalid positions and/or filled invalid bits. In some other embodiments, the written N bits may also be read in a sequence different from the above ones.

Particularly, in some embodiments, blocks 730 and 740 may at least be partially performed in parallel to further boost efficiency and reduce system delay. For example, a read operation may start from the position y(H-1, 0) when the write operation for the position y(H-1, 0) is completed.

The solution for interleaving data in a wireless communication system has been described above from the perspective of a transmitting device. However, it should be understood that the above operations are reversible. For example, a reverse operation corresponding to the above interleaving operation may be performed at a receiving device to de-interleave the data and further restore the order of bits. Meanwhile, it should also be appreciated that, in some embodiments, a reverse operation corresponding to the above operation may be applied at a transmitting device for performing the interleaving operation while the above operation may be correspondingly applied at a receiving device for performing the de-interleaving operation to achieve similar effects. In other words, although the solution for interleaving data in the wireless communication system has been described above from the perspective of the transmitting device, its application should not be limited to the transmitting device. On the contrary, this solution may also be applied at the receiving device. For the sake of simplification, the implementations mentioned above will not be repeated herein. However, it should be understood that all of the above implementations fall within the protection scope of the present disclosure.

Moreover, although the solution of interleaving data is described above in the environment of a wireless communication system, it should be understood that the application of the solution is not limited to the wireless communication field. On the contrary, the solution may also be applied in other fields, such as the optical disc storage field where it is expected to store and/or transmit consecutive bits dispersedly to enhance error-correcting performance.

Technical effects of the embodiments of the present disclosure over the conventional solution in FIG. 2 are further described in details below with reference to FIGS. 11-15.

First of all, the data interleaving solution according to embodiments of the present disclosure is compared with the conventional solution shown by FIG. 2 in aspects of the minimum spread distance and average spread distance. For example, the minimum spread distance and the average spread distance may be defined as follows:

$$\text{Minimum spread distance} = \min_{k=0,1,2\ldots N-1} |\pi(b_k) - \pi(b_{k+1})|$$

$$\text{Average spread distance} = \frac{\min_{k=0,1,2\ldots N-1} |\pi(b_k) - \pi(b_{k+1})|}{N-1}$$

Figure 11:
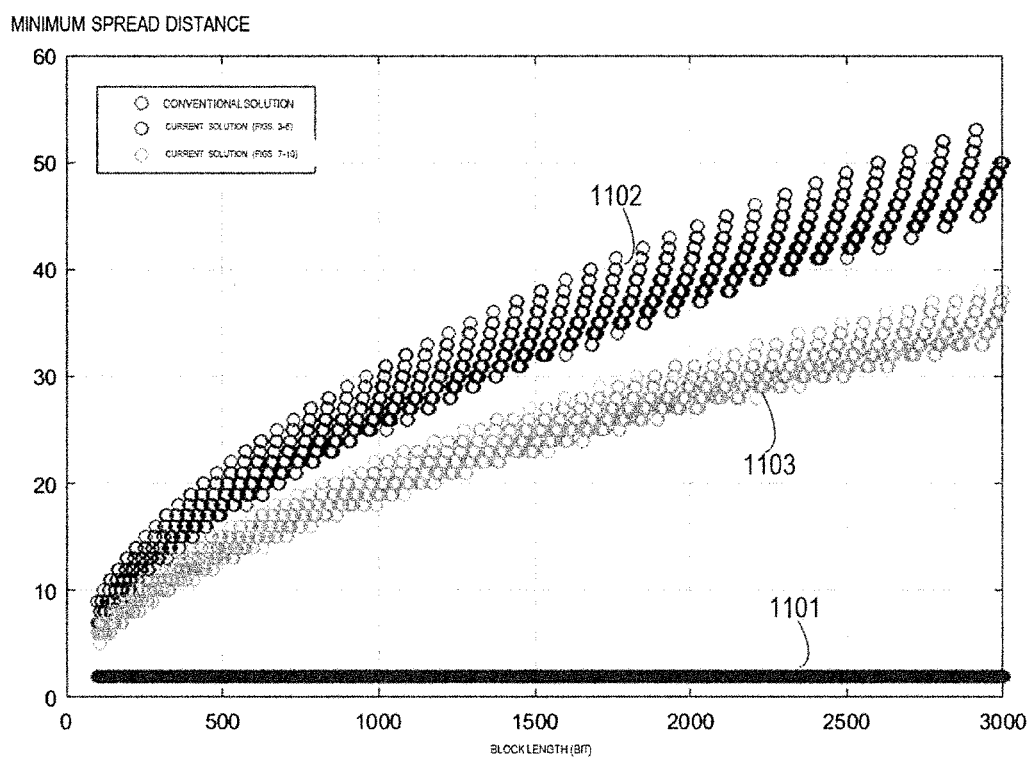
FIG. 11 illustrates a schematic diagram of performance comparison between a conventional solution and the embodiments of the present disclosure in the aspect of the minimum spread distance.

FIG. 11 illustrates a schematic diagram of performance comparison between the conventional solution shown in FIG. 2 and embodiments of the present disclosure shown in FIGS. 3-6 and 7-10 in the aspect of the minimum spread distance. As shown in FIG. 11, the curve of the conventional solution shown by FIG. 2 is flat because the minimum spread distance is fixed at 2 (as indicated by label 1101) regardless of the sequence length or the side length of the triangular interleaver. Correspondingly, the minimum spread distance increases greatly (as indicated by labels 1102 and 1103) in the solution of the embodiments of the present disclosure, thereby the system performance can be improved.

Figure 12:
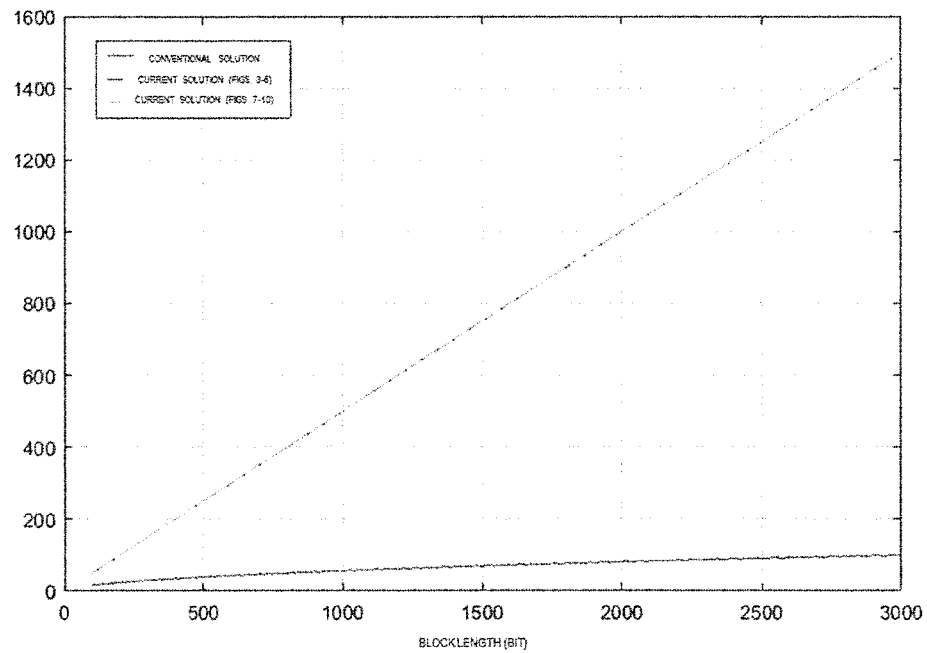
FIG. 12 illustrates a schematic diagram of performance comparison between a conventional solution and the embodiments of the present disclosure in the aspect of the average spread distance.

FIG. 12 illustrates a schematic diagram of performance comparison between the conventional solution shown by FIG. 2 and embodiments of the present disclosure shown in FIGS. 3-6 and 7-10 in the aspect of the average spread distance. It may also be observed that the technical effects of the solution according to embodiments of the present disclosure are obviously superior to the conventional solution shown by FIG. 2.

Figure 13:
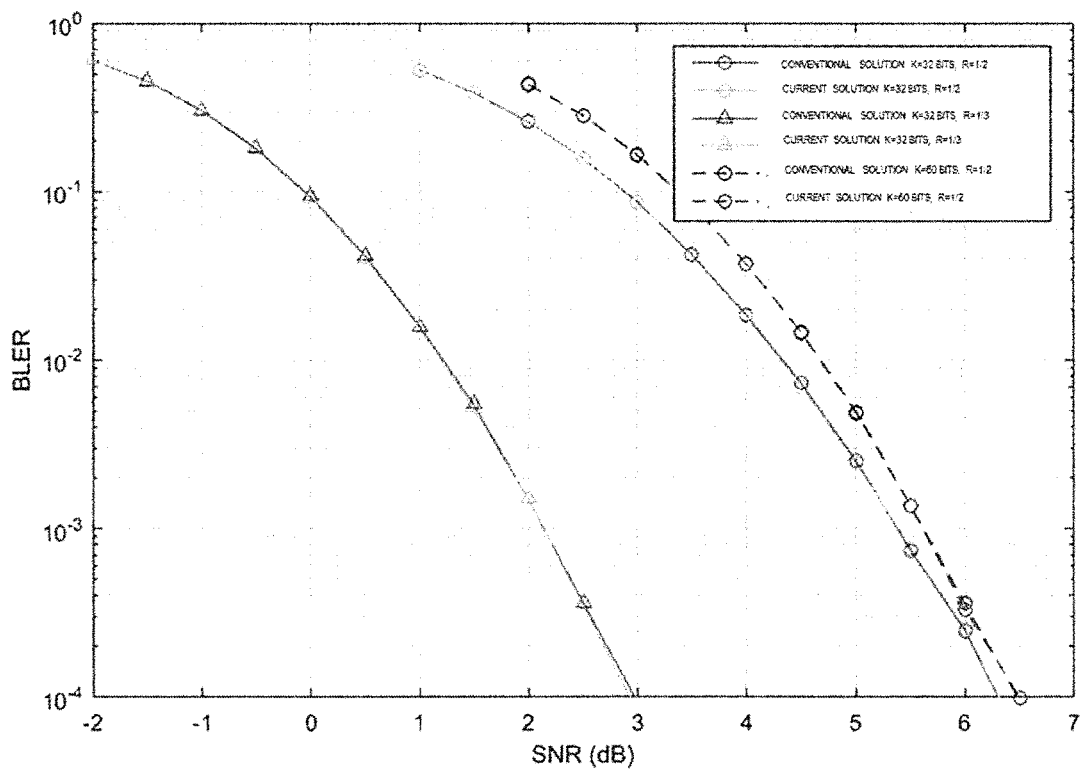
FIGS. 13-15 respectively illustrate schematic diagrams of performance comparison among QPSK, 16QAM and 64QAM in the aspects of Signal to Noise Ratio (SNR) and BLER.
Figure 14:
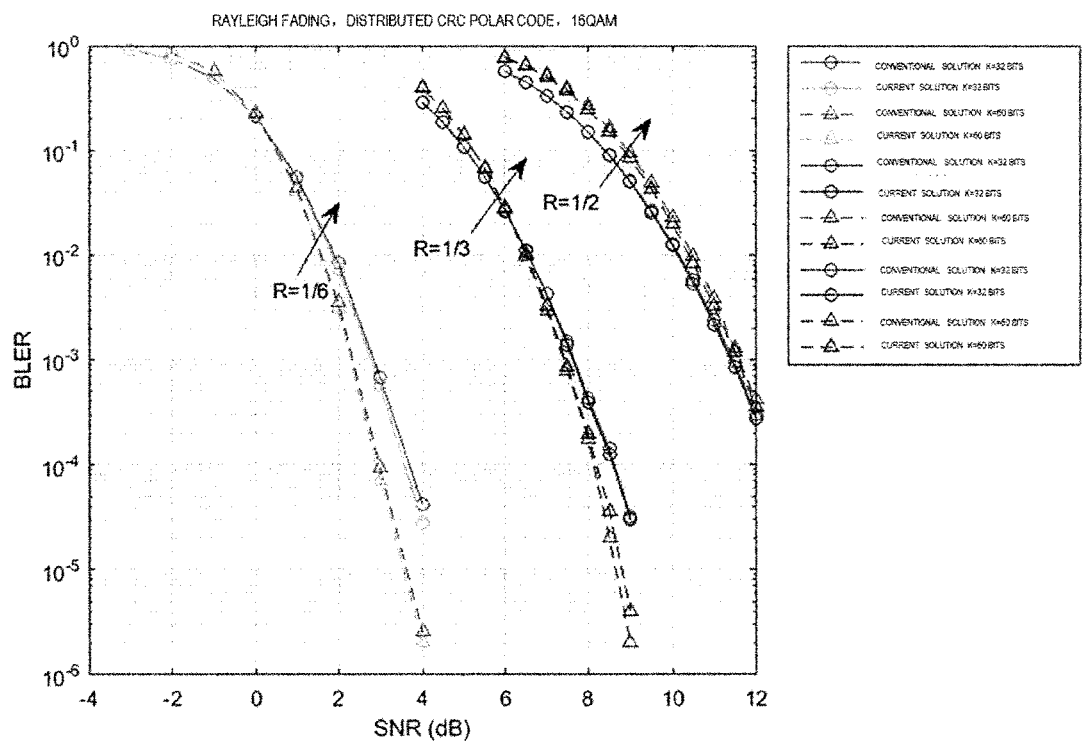
Figure 15:
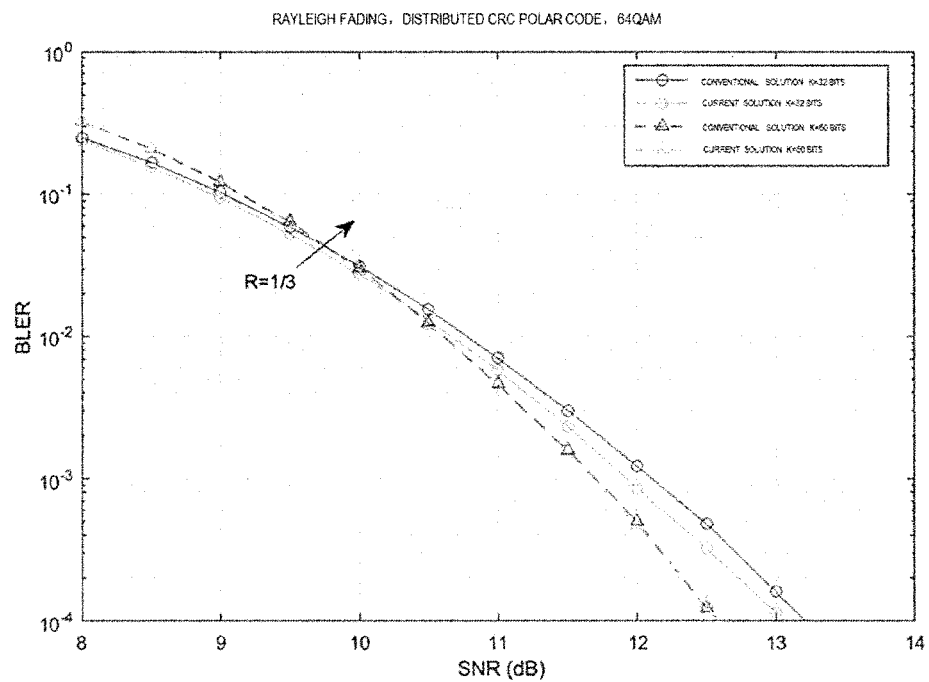

FIGS. 13-15 respectively illustrate schematic diagrams of performance comparison among QPSK, 16QAM and 64QAM in the aspects of Signal to Noise Ratio (SNR) and BLER. For the purpose of simplification, the schematic diagrams only demonstrate comparisons between the conventional solution shown in FIG. 2 and the embodiments of the present disclosure shown in FIGS. 3-6. In various conditions, it is obvious that the performance of the solution according to embodiments of the present disclosure is superior to the performance of the conventional solution shown by FIG. 2 in the aspects of SNR and BLER.

Figure 16:
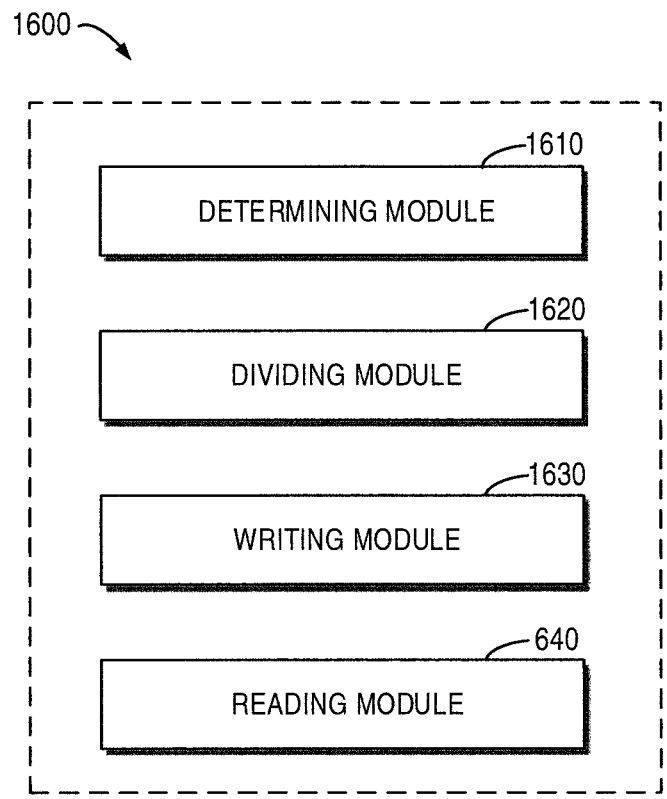
FIG. 16 illustrates a block diagram of a device 1600 for interleaving data in a wireless communication system accordance to some embodiments of the present disclosure.

FIG. 16 illustrates a block diagram of a device 1600 for interleaving data in a wireless communication system accordance to some embodiments of the present disclosure. In some embodiments, the device 1600 may be implemented at a communication device which acts as a transmitting device, for example, at the side of the terminal device 111 or 112 or at the network device 101 in FIG. 1. The device 1600 may be a software module-based system or a hardware component such as a transceiver.

As shown in FIG. 16, the device 1600 may include: a determining module 1610 configured to determine, based on the number of a plurality of bits to be interleaved, the size of an interleaving array for interleaving the plurality of bits; a dividing module 1620 configured to divide the plurality of bits into a plurality of subsets based on the size of the interleaving array; a writing module 1630 configured to write the plurality of subsets respectively into the interleaving array; and a reading unit 1640 configured to read the written plurality of bits from the interleaving array in a predetermined order.

For the purpose of clarity, some optional modules of the device 1600 are not illustrated in FIG. 16. However, it should be understood that the respective features described above with reference to FIGS. 3-10 are also applicable to the device 1600. Besides, each module of the device 1600 may be a hardware module or a software module. In some embodiments, the device 1600 may be partially or fully implemented using a software and/or firmware, for example, implemented as computer program products included in a computer-readable medium. Alternatively or additionally, the device 1600 may be partially or fully implemented based on a hardware, for example, may be implemented as an Integrated Circuit (IC), Application Specific Integrated Circuit (ASIC), a System-on-Chip (SOC) and a Field Programmable Gate Array (FPGA) etc. The scope of the present disclosure is not limited in this regard.

Figure 17:
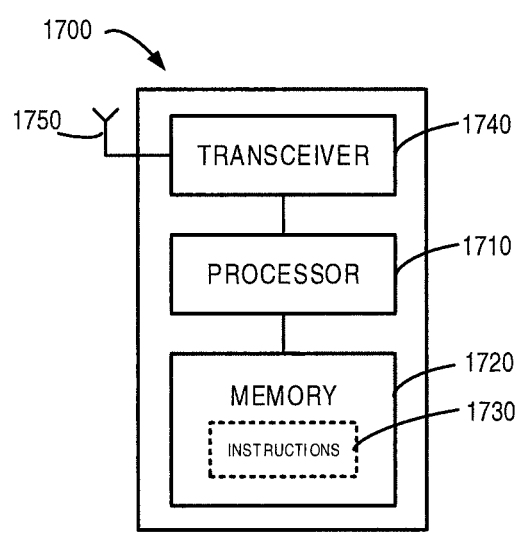
FIG. 17 illustrates a block diagram of a communication device 1700 suitable for implementing embodiments of the present disclosure.

FIG. 17 illustrates a block diagram of a communication device 1700 suitable for implementing embodiments of the present disclosure. The device 1700 may be used for implementing the transmitting device or the receiving device in the embodiments of the present disclosure, for example, the network device 101 or the terminal device 111 or 112 shown in FIG. 1.

According to the example of FIG. 17, the device 1700 includes a processor 1710 controlling operations and functions of the device 1700. For example, in some embodiments, the processor 1710 may perform various operations by means of instructions 1730 stored in a memory 1720 coupled to the processor. The memory 1720 may be of any suitable types adapted to local technical environment and may also be implemented using any appropriate data storage technologies, including but is not limited to a semiconductor-based storage device, a magnetic memory and a system and an optical memory and a system. Although FIG. 17 only illustrates one memory cell, the device 1700 may include a plurality of different physical memory cells.

The processor 1710 may be of any suitable types adapted to a local technical environment, including but is not limited to, a general-purpose computer, a dedicated computer, a microcontroller, a Digital Signal Processor (DSP) and one or more cores in controller-based multicore controller architecture. The device 1700 also may include a plurality of processors 1710, which may be coupled to a transceiver 1740, where the transceiver 1740 may receive and transmit the information by means of one or more antennas 1750 and/or other components.

According to embodiments of the present disclosure, the processor 1710 and the memory 1720 may cooperate with each other to implement the methods 300, 400, 700 and/or 800 described above with reference to FIGS. 3-4 and 7-8. It should be appreciated that all features described above are applicable to the device 1700 and will not be repeated herein.

Generally speaking, various example embodiments of the present disclosure may be implemented in hardware, dedicated circuits, software, logic or any combination thereof. Some aspect may be implemented in hardware while other aspects may be implemented in firmware or software executed by controllers, microprocessors or other computing devices. When each aspect of embodiments of the present disclosure is illustrated or described as block diagram and flowchart or represented by some other graphics, it should be understood that the block, device, system, technology or method described herein may be implemented in hardware, a software, firmware, dedicate circuits, logic, a general-purpose hardware, a controller, or other computing devices, or any other combinations thereof as non-restrictive examples.

As an example, embodiments of the present disclosure may be described in the context of machine-executable instructions, which is included in program modules executed in devices on a target physical or virtual processor for example. In general, program modules include routines, programs, libraries, objects, classes, components, data architecture etc. and perform particular tasks or implement particular abstract data structure. In each embodiment, functions of the program module may be merged or divided between the described program modules and the machine-executable instructions for program modules may be executed in local or distributed devices. In the distributed devices, program modules may be positioned in local and remote storage media.

The computer program codes for implementing method of the present disclosure may be written in one of more kinds of programming languages. The computer program codes may be provided to processors of a general-purpose computer, a dedicated computer or other programmable data processing devices, such that the program codes, when executed by a computer or other programmable data processing devices, cause the implementation of functions/operations specified in the flowchart and/or block diagram. The program codes may be executed entirely on a computer, partially on the computer, as an independent software package, partially on the computer and partially on the remote computer or entirely on the remote computer or server.

In the context of the present disclosure, a machine-readable medium may be any tangible medium that includes or stores programs for or related to an instruction executing system, an apparatus or a device. The machine-readable medium may be machine-readable signal medium or machine-readable storage medium and may include, but is not limited to, an electronic, magnetic, optical, electromagnetic, infrared semiconductor system, apparatus or device, or any suitable combinations thereof. The more specific examples of the machine-readable storage medium include an electrical connection including one or more wires, a portable computer disk, a hard disk, a random-access memory (RAM), a read-only memory (ROM), an erasable programmable read-only memory (EPROM or flash), an optical storage device, a magnetic storage device, or any suitable combinations thereof.

Furthermore, although the operations are depicted in a particular order, it should be appreciated that the operations are not required to be completed in the particular order or in succession, or not all operations shown in the drawings need to be executed to obtain the expected result. In some cases, multitasking or multiprocessing is also beneficial. Likewise, although the above discussion includes some particular implementation details, they should not be interpreted as limiting the scope of the invention or claims. On the contrary, they should be appreciated as description for particular embodiments of the particular invention. Some features described separately in the context of the embodiments of the description can also be integrated and implemented in a single embodiment. Conversely, all kinds of features described in the context of a single embodiment can also be separately implemented in multiple embodiments or any suitable sub-combinations.

Although the subject matter has been described in language specific to structural features and/or method actions, it should be understood that the subject matter defined in the attached claims is not limited to the above described particular features or actions. On the contrary, the above described specific features and actions are disclosed for implementing examples of the claims.

We claim:

1. A method of interleaving data in a wireless communication system, comprising:
   determining, based on the number of a plurality of bits to be interleaved, a size of an interleaving array for interleaving the plurality of bits, wherein the number of rows is H and the number of columns is 2H-1 in the interleaving array;
   dividing the plurality of bits into a plurality of subsets based on the size of the interleaving array, such that an i-th subset of the plurality of subsets at most comprises 2(H-1-i)+1 consecutive bits, wherein i is a nonnegative integer smaller than H;
   writing the plurality of subsets respectively into the interleaving array, comprising for the i-th subset:
      writing an initial bit in the i-th subset into a position y(i, H-1) in an i-th row and an (H-1)-th column of the interleaving array; and
      writing subsequent bits of the initial bit respectively into subsequent rows of the i-th row, wherein at least two positions for writing the subsequent bits in an r-th row comprise y(r, H-1-(r-i)) and y(r, H-1+(r-i)); and
   reading the written plurality of bits successively column by column from the interleaving array.

2. The method of claim 1, wherein the number of the plurality of bits is N and determining the size of the interleaving array comprises:
   determining the number of rows H in the interleaving array, such that H is a minimum integer satisfying $H^2 \geq N$.

3. The method of claim 1, wherein a region for writing the plurality of bits in the interleaving array forms an isosceles triangle, and wherein a height of the isosceles triangle is H and a length of a base of the isosceles triangle is 2H-1.

4. The method of claim 1, wherein the subsequent bits in the i-th subset comprise a first bit and a second bit immediately following the first bit, the first bit and the second bit are to be written into the r-th row of the interleaving array, and wherein writing the subsequent bits of the initial bit respectively into the subsequent rows of the i-th row comprises:
    writing the first bit into a position y(r, H-1-(r-i)) and writing the second bit into a position y(r, H-1+(r-i)); or
    writing the second bit into a position y(r, H-1-(r-i)) and writing the first bit into a position y(r, H-1+(r-i)).

5. The method of claim 1, wherein writing the plurality of subsets respectively into the interleaving array further comprises:
    writing the plurality of subsets concurrently into the interleaving array.

6. The method of claim 1, wherein reading the written plurality of bits successively column by column from the interleaving array comprises:
    in response to completion of writing to a predetermined column in the interleaving array, reading the written plurality of bits successively column by column by starting from the predetermined column.

7. A device for interleaving data in a wireless communication system, comprising:
    a processor; and
    a memory storing instructions which, when executed by the processor, cause the device to perform the method according to claim 1.

8. A computer-readable storage medium comprising machine-executable instructions which, when executed by a device, cause the device to perform the method according to claim 1.

9. A method of interleaving data in a wireless communication system, comprising:
    determining, based on the number of a plurality of bits to be interleaved, a size of an interleaving array for interleaving the plurality of bits, wherein both the number of rows and the number of columns are H in the interleaving array;
    dividing the plurality of bits into a plurality of subsets based on the size of the interleaving array, such that an i-th subset of the plurality of subsets at most comprises 2(H-2i)-1 consecutive bits, wherein i is a nonnegative integer smaller than H/2;
    writing the plurality of subsets respectively into the interleaving array, comprising for the i-th subset:
        writing an initial bit in the i-th subset into a position in the interleaving array where both a row index and a column index are i;
        determining at least one position for writing subsequent bits of the initial bit by alternately increasing a row index and a column index with respect to the position; and
        writing the subsequent bits successively into the determined at least one position; and
    reading, by starting from a predetermined position of the interleaving array and alternately decreasing a row index and increasing a column index with respect to the predetermined position, the written plurality of bits from the interleaving array.

10. The method of claim 9, wherein the number of the plurality of bits is N, and wherein determining the size of the interleaving array comprises:
    determining the number of rows H in the interleaving array, such that H is a minimum integer satisfying $$\frac{H(H+1)}{2} \geq N.$$

11. The method of claim 9, wherein a region for writing the plurality of bits in the interleaving array forms an isosceles right triangle, and wherein a length of a side of the isosceles right triangle is H.

12. The method of claim 9, wherein the subsequent bits in the i-th subset comprise a first bit immediately following the initial bit and a second bit immediately following the first bit, and wherein determining the at least one position for writing the subsequent bits comprises:
    determining a first position for writing the first bit, such that a row index of the first position is (i+1) and a column index of the first position is i; and
    determining a second position for writing the second bit, such that a column index of the second position is (i+1) and a row index of the second position is i.

13. The method of claim 12, wherein the subsequent bits in the i-th subset further comprise a third bit immediately following the second bit and a fourth bit immediately following the third bit, and wherein determining the at least one position for writing the subsequent bits comprises:
    determining a third position for writing the third bit, such that a row index of the third position is (i+2) and a column index of the third position is i; and
    determining a fourth position for writing the fourth bit, such that a column index of the fourth position is (i+2) and a row index of the fourth position is i.

14. The method of claim 9, wherein writing the plurality of subsets respectively into the interleaving array further comprises:
    writing the plurality of subsets concurrently into the interleaving array.

15. The method of claim 9, wherein reading the written plurality of bits from the interleaving array comprises:
    in response to completion of writing to a predetermined position, reading the written plurality of bits from the interleaving array by starting from the predetermined position and by alternately decreasing a row index and increasing a column index with respect to the predetermined position.

16. A device for interleaving data in a wireless communication system, comprising:
    a processor; and
    a memory storing instructions which, when executed by the processor, cause the device to perform the method according to claim 9.

17. A computer-readable storage medium comprising machine-executable instructions which, when executed by a device, cause the device to perform the method according to claim 9.

* * * * *